(12) United States Patent
Heidenreich

(10) Patent No.: US 7,576,282 B2
(45) Date of Patent: Aug. 18, 2009

(54) PHOTOVOLTAIC AWNING STRUCTURES

(75) Inventor: David C. Heidenreich, Akron, OH (US)

(73) Assignee: EBO Group, Inc., Sharon Center, OH (US)

( * ) Notice: Subject to any disclaimer, the term of this patent is extended or adjusted under 35 U.S.C. 154(b) by 225 days.

(21) Appl. No.: 11/442,564

(22) Filed: May 30, 2006

(65) Prior Publication Data

US 2007/0277867 A1 Dec. 6, 2007

(51) Int. Cl.
*H01L 25/00* (2006.01)
*H01L 31/00* (2006.01)
*H01L 31/042* (2006.01)
*H02N 6/00* (2006.01)
*E04F 10/06* (2006.01)

(52) U.S. Cl. .................... 136/244; 136/243; 136/245; 160/66

(58) Field of Classification Search ................. None
See application file for complete search history.

(56) References Cited

U.S. PATENT DOCUMENTS

| | | | | |
|---|---|---|---|---|
| 104,900 | A * | 6/1870 | Thalhofer ............... | 160/22 |
| 3,460,602 | A * | 8/1969 | Hugus ................... | 160/265 |
| 4,636,579 | A * | 1/1987 | Hanak et al. ........... | 136/245 |
| 5,212,916 | A * | 5/1993 | Dippel et al. ........... | 52/82 |
| 5,391,235 | A * | 2/1995 | Inoue .................... | 136/244 |
| 6,812,397 | B2 * | 11/2004 | Lambey ................. | 136/245 |
| 2001/0023703 | A1 * | 9/2001 | Kondo et al. ........... | 136/244 |

* cited by examiner

*Primary Examiner*—Kaj K Olsen
*Assistant Examiner*—Kourtney R Salzman
(74) *Attorney, Agent, or Firm*—Renner, Kenner, Greive, Bobak, Taylor & Weber

(57) ABSTRACT

A photovoltaic awning assembly includes a sheet of material carrying photovoltaic strips thereon. A rotatable roll receives the sheet of material and has a contoured drum at opposite ends thereof for deploying and retrieving the sheet of material through the use of a cable connected to a boom at an opposite end of the sheet. A pair of support tubes extend along opposite sides of the sheet of material, and support legs serve to position the sheet. In one embodiment of the invention, one of the support legs is out of plane with the others, introducing a saddle surface in the sheet of material to provide it with stability to resist wind. The roll for retrieving and maintaining the material is constructed of a non-metallic material such as corrugated fiberglass sheet, rolled about take-up drums at opposite ends thereof, and having reinforcing flanged disks in the interior thereof. The corrugations provide conduits for the passage of electrical conductors to an externally maintained control box. Retracting of the awning sheet is facilitated by means of a spring maintained in side rails that is loaded when the awning is deployed, and which assists in the retraction of the awning, when required. A cable is interposed between the boom of the awning and the take-up drum, passing through a pulley arrangement to achieve the desired loading of the spring. An adjustment of the spring tension is provided by bolt adjustment.

15 Claims, 7 Drawing Sheets

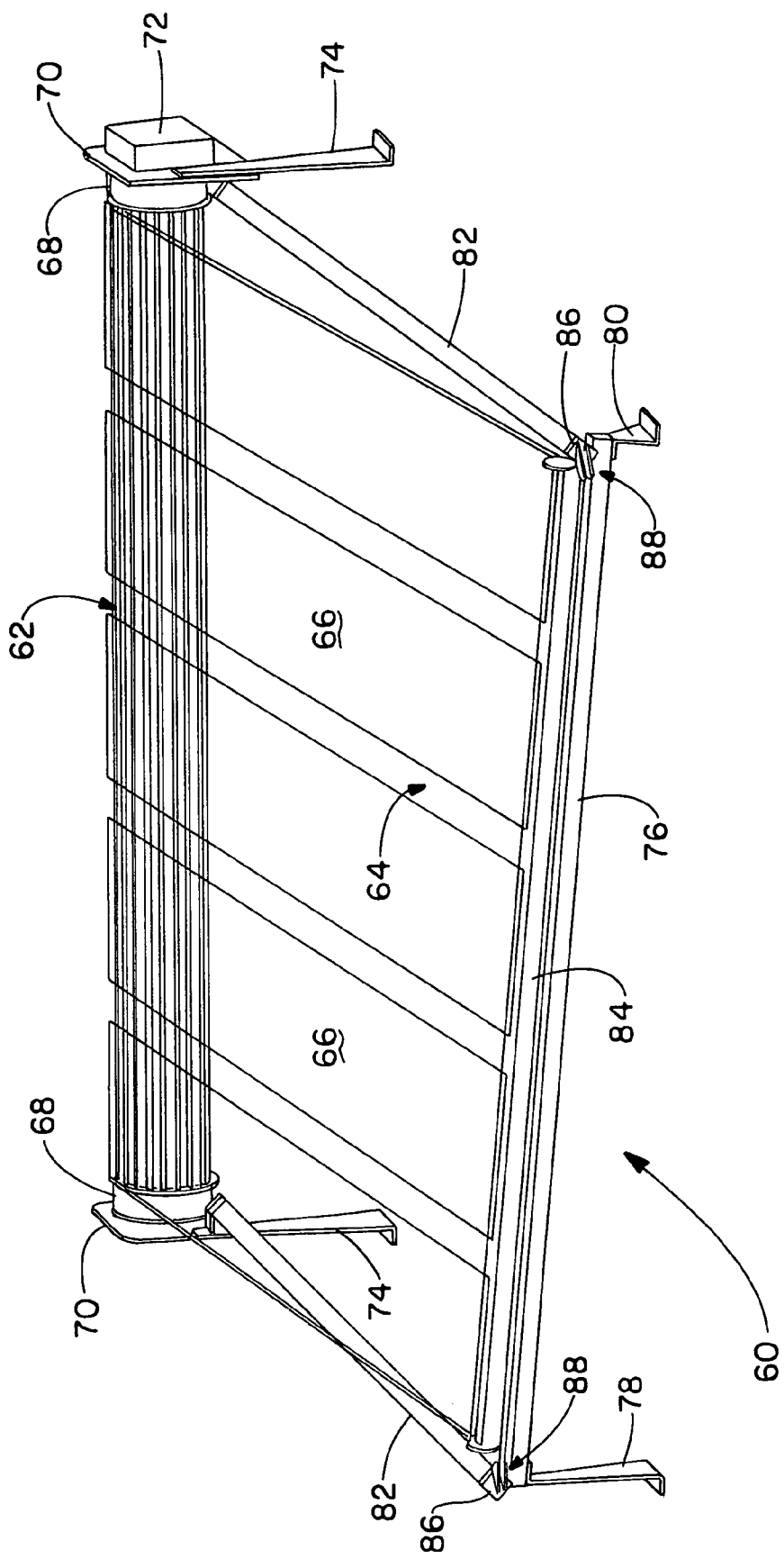

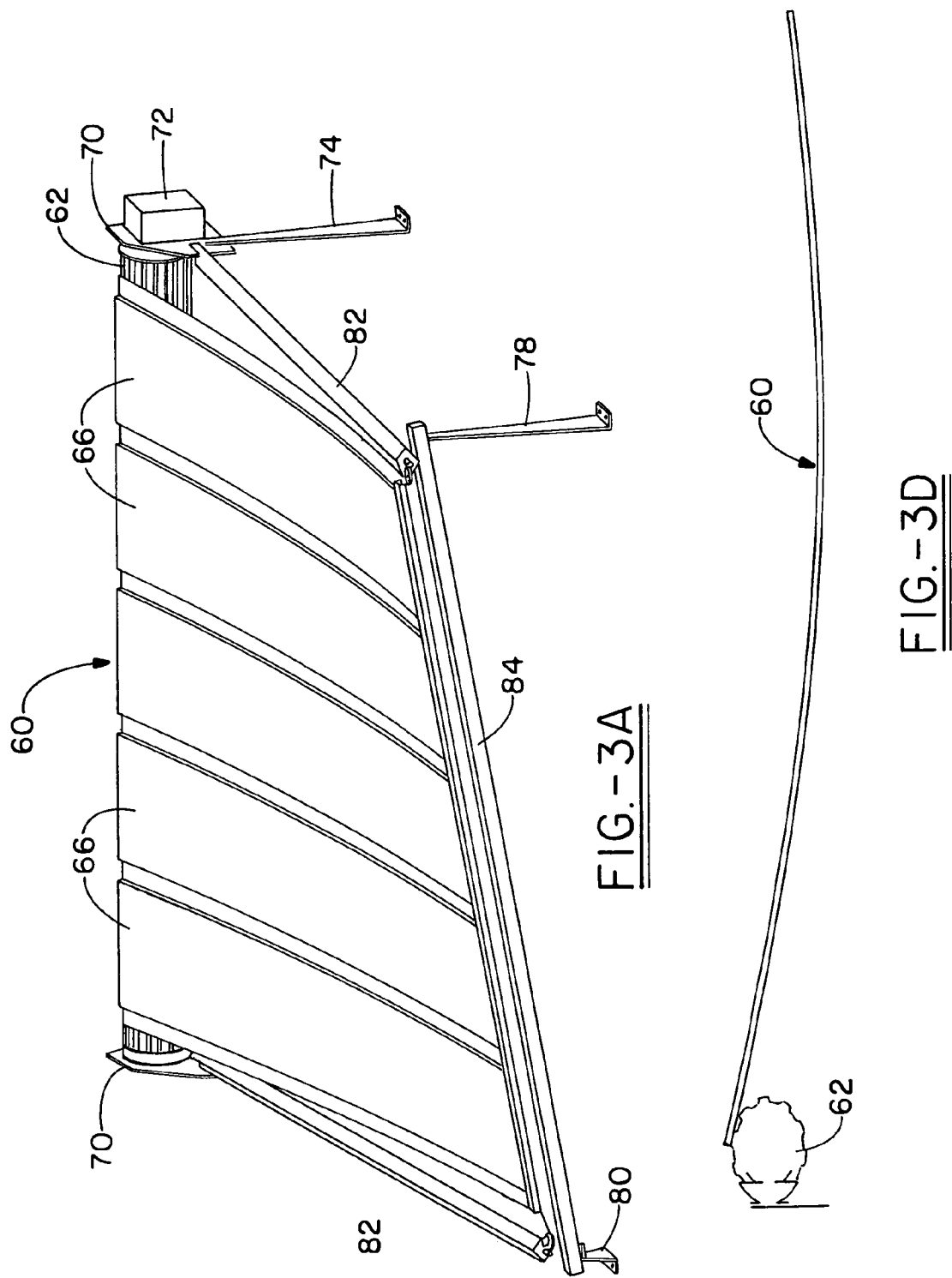

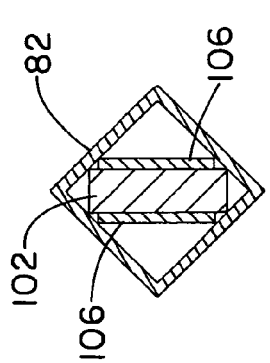
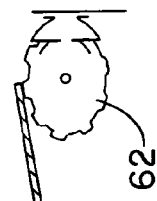
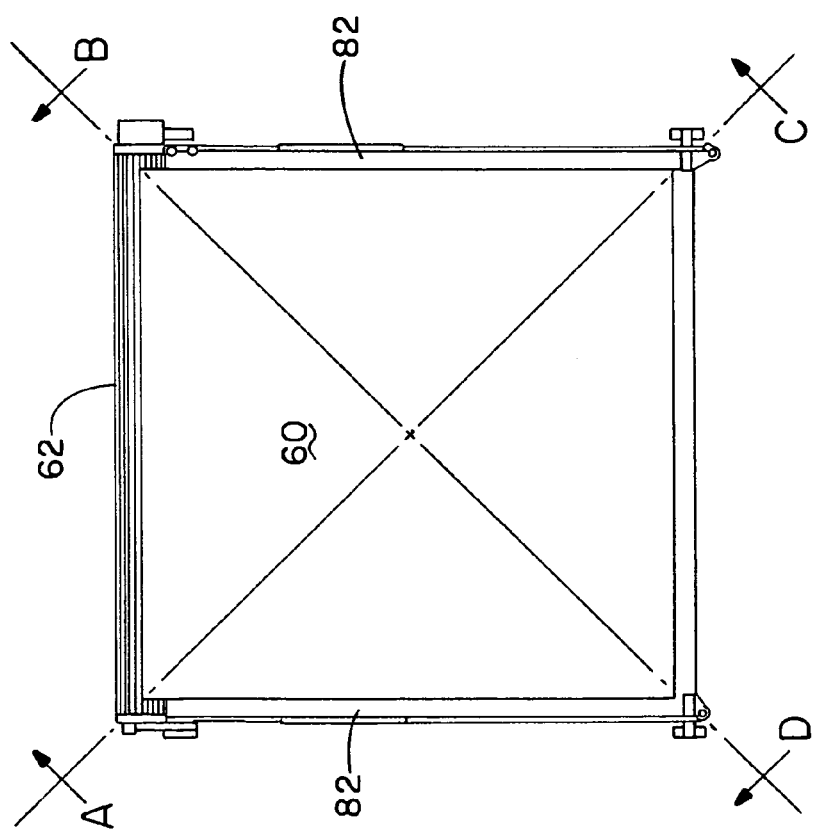

PHOTOVOLTAIC AWNING STRUCTURES

TECHNICAL FIELD

The invention herein resides in the art of electrical energy producing systems and, more particularly, to such systems that employ photovoltaic devices that serve to convert light energy into electrical energy. More particularly, the invention relates to a photovoltaic energy producing system implemented in the form of a deployable and retractable awning. Specifically, the invention relates to a photovoltaic awning structure system that integrates DC wiring and components and that is configured to maintain its integrity in high winds, provide a structure for effectively transmitting the energy produced to a distribution system, and that is readily deployed and retracted.

BACKGROUND ART

The use of photovoltaic devices to convert light energy into electrical energy is commonly known. However, the physical structure of such systems require custom design and field installation of multiple modules to generate sufficient energy to meet the power needs of even small commercial or residential buildings. The direct current elements of these installations often do not meet electric codes and pose safety hazards due to the lack of DC acumen of electricians and inspectors. Common problems are discussed in Sandia Report, SAND L005-0342, pp. 1 and 2, and include, by way of example: improper ampacity of conductors; improper types of conductors; improper or unsafe wiring methods; lack of or improper overcurrent protection on conductors; improper system grounding; lack of, or improper equipment grounding; use of underrated hardware or components; and use of AC components such as fuses and switches in DC applications.

The problems of the prior art are further aggravated when photovoltaic devices are contemplated for deployment in a retractable awning-like structure. Indeed, winds and snow loads are significant barriers to the use of anything but formidable structures to carry power generating systems of photovoltaic devices. The physical size of an awning required to generate significant amounts of electrical energy frustrate efforts of deployment and retraction, which are required to avoid damage or destruction when inclement weather or high winds rapidly approach.

There remains a need in the art for a photovoltaic awning structure that may be quickly and easily deployed and retracted, that demonstrates a high degree of stability in windy environments, that facilitates and accommodates ease of generation and transmission of electrical power therefrom and to a grid or other source of utility, that includes DC components and wiring in an integrated code-compliant system, and that can be easily installed and maintained in any of numerous locations.

DISCLOSURE OF INVENTION

In light of the foregoing, it is a first aspect of the invention to provide a photovoltaic deployable and retractable awning structure that demonstrates a high degree of stability in windy environments.

A further aspect of the invention is the provision of a photovoltaic deployable and retractable awning structure that is conducive to ganging of a plurality of photovoltaic strips or devices thereon, sufficient to generate electrical power in utilitarian amplitudes.

Still a further aspect of the invention is the provision of a photovoltaic deployable and retractable awning structure that is quickly and easily deployed and retracted.

Another aspect of the invention is the provision of a photovoltaic deployable and retractable awning structure that integrates the DC components and wiring and provides effective ground fault and over current protection.

Yet a further aspect of the invention is the provision of a photovoltaic deployable and retractable awning structure that is cost effective and easy to implement, providing for stability and physical integrity in use, and capable of generating a significant amplitude of electrical power, while being easy to deploy and retract, and that can be constructed with presently known state of the art elements.

The foregoing and other aspects of the invention that will become apparent as the detailed description proceeds are achieved by a photovoltaic deployable and retractable awning assembly, comprising: a sheet of photovoltaic devices; a rotatable roll receiving said sheet and adapted to alternatively rotatably pay-out said sheet and retract and retrieve said sheet; a contoured drum at opposite ends of said roll; a boom at an end of said sheet opposite said roll; a cable connected to said boom at each of opposite ends thereof, said cables being windingly received by said contoured drums; a pair of support tubes extending along opposite edges of said sheet between said ends of said booms and said contoured drums.

BRIEF DESCRIPTION OF DRAWINGS

For a complete understanding of the various aspects of the invention, reference should be made to the following detailed description and accompanying drawings wherein:

FIG. 3 is a perspective view of a photovoltaic awning structure made in accordance with the invention, showing the same in arrangement to achieve a saddle-configuration of the awning in deployment;

FIG. 3A is a schematic illustration of a photovoltaic awning similar to that of FIG. 3, showing the resulting saddle configuration;

FIG. 3B is a top plan view of the awning of FIG. 3A;

FIG. 3C is a cross sectional view of the awning of FIG. 3B, taken along the line B-D;

FIG. 3D is a cross sectional view of the awing of FIG. 3B, taken along the line A-C;

FIG. 7 is a cross sectional view of the side rail of FIG. 5, shown within a side support tube in accordance with the invention.

BEST MODE FOR CARRYING OUT THE INVENTION

Figure 1:
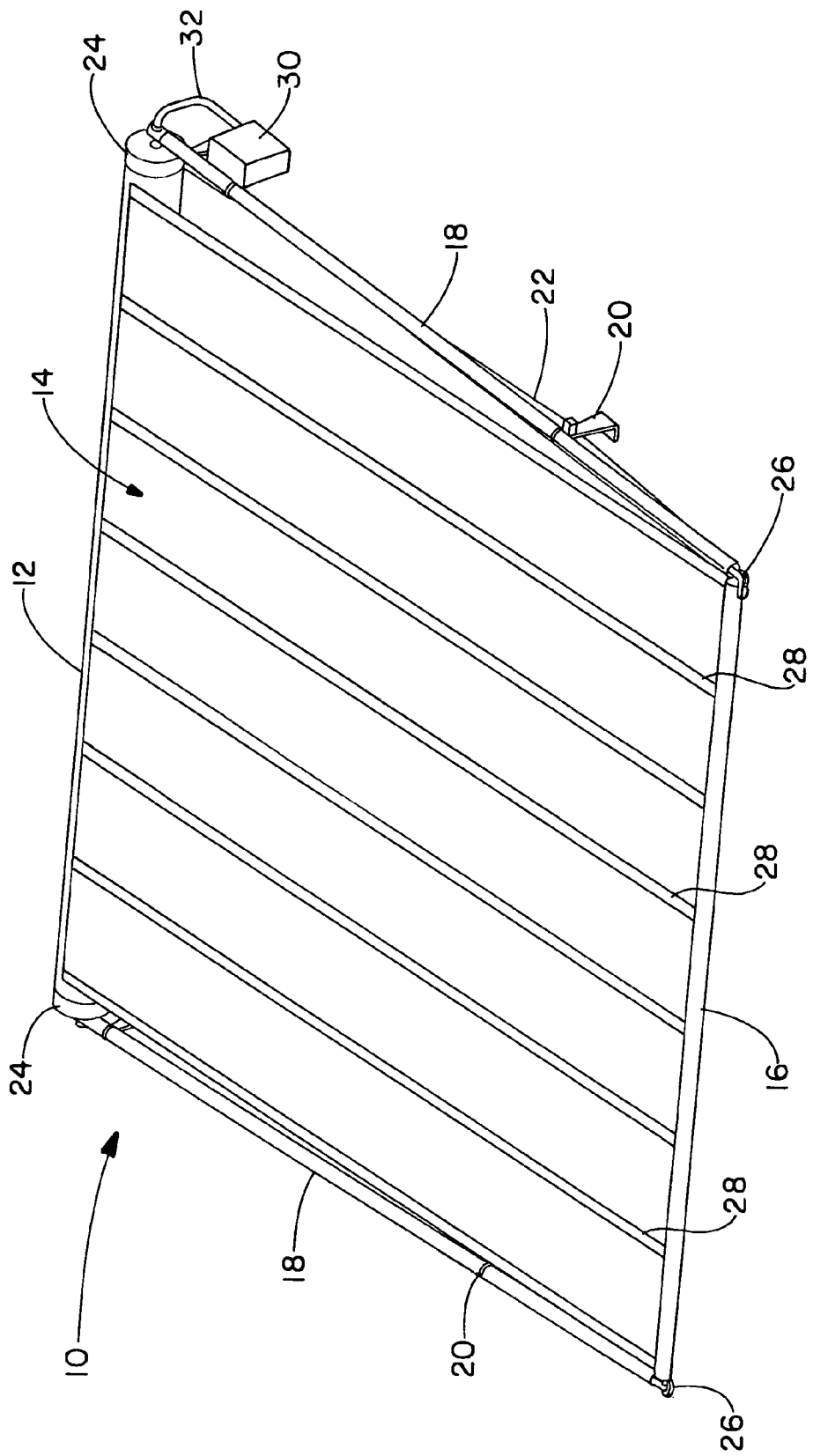
FIG. 1 is a perspective view of a photovoltaic awning structure particularly adapted for residential use and made in accordance with the invention.

Referring now to the drawings and more particularly to FIG. 1, it can be seen that a photovoltaic awning made in accordance with the invention is designated generally by the numeral 10. The awning 10 includes a cylindrical roll 12 at one end thereof, adapted for receiving and retrieving thereabout a flexible awning 14, made of appropriate fabric, thin film or the like. The awning 14 is deployable from and retrievable by the cylindrical roll 12, as will become apparent herein.

At an end of the awning 14, opposite that of the cylindrical roll 12 is a boom 16 which is typically an elongated tube of appropriate cross section. Support tubes 18 extend along each side of the awning 14, connected at opposite ends to the awning roll 12 as by journals or the like. The support tubes 18 are additionally supported by appropriate tube mounts 20, as shown. Cables 22 are fixed to opposite ends of the boom 16 at first ends thereof and wrapped around a contoured or tapered drum 24 at opposite ends of the roll 26 at associated ends of the support tubes 18. The contoured drum 24 is of the nature and kind presented and described in co-pending patent application Ser. No. 10/977,749, filed on Oct. 29, 2004. The contoured drum provides force compensation during deployment and retraction of the awning 14 about the roll 12 by providing compensation for the changing effective thickness of the roll 12 as the awning 14 is wrapped thereon or unwrapped therefrom.

A pulley 26 is positioned at the boom end of each of the support tubes 18, with each cable being attached to an end of the boom and extending around an associated pulley 26 at the extension end of the support tubes 18. The pulley and/or awning roll attachments are biased outwardly with compression springs, such that as the awning is extended it further compresses the springs. The increasing spring force during extension and the drum radius being slightly larger than the awning on the roll at any point in time, a bias is created to retract the awning automatically, as presented in the aforementioned co-pending patent application.

Photovoltaic strips 28 are provided longitudinally on the fabric of the awning 14 and are of any particular desired nature or structure. The strips 28 are ganged together in series, in a manner to be described with respect to FIG. 2, and interconnect with a control box 30 that has desired control devices therein, a possible DC to AC inverter, and a controller for engaging and disengaging the roll 12. A conduit 32 carries electrical conductors to the interior of the roll 12 for connection with the photovoltaic strips 28, and for passing the current therefrom to an appropriate receiver in the control box 30.

Figure 2:
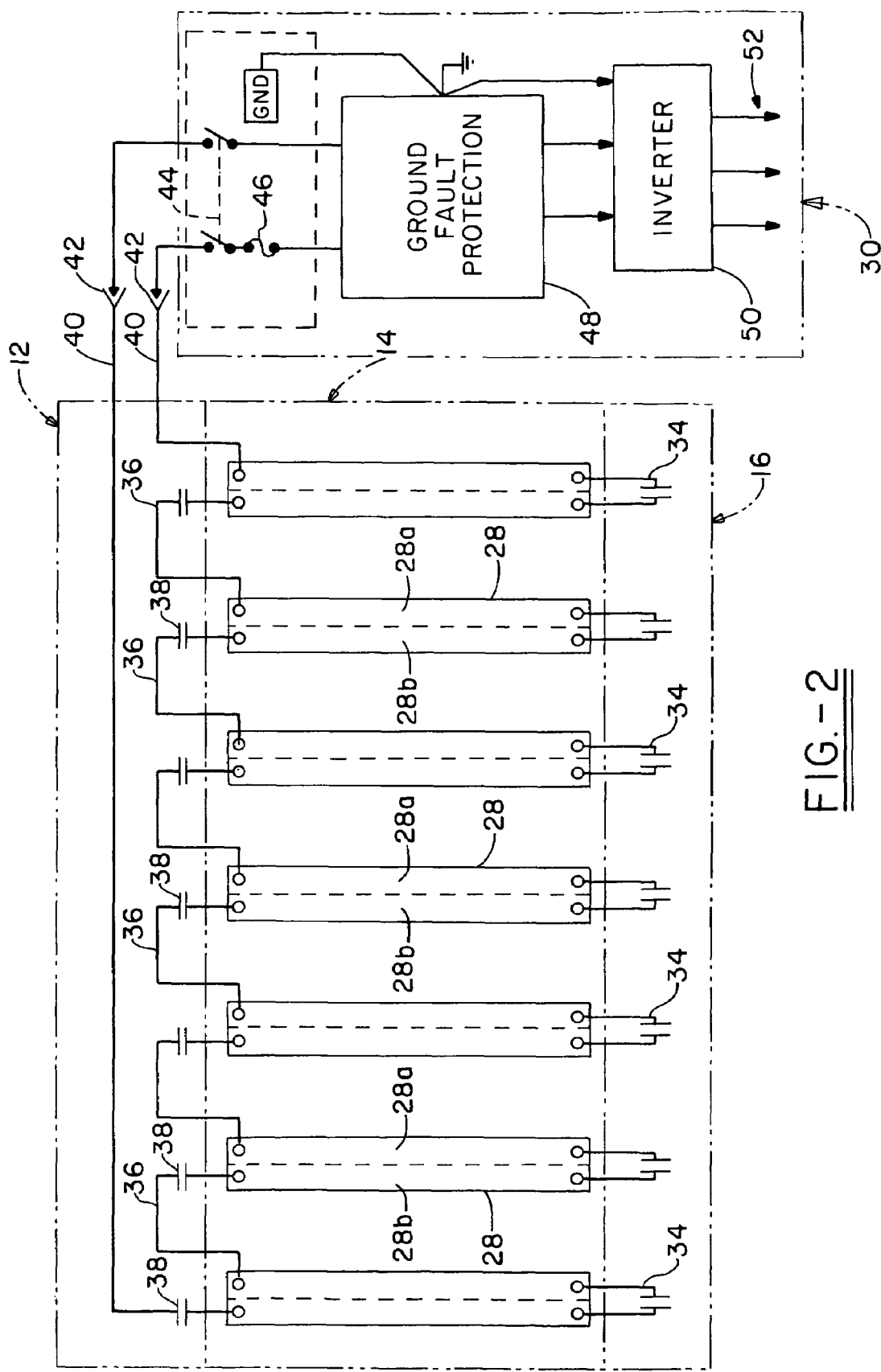
FIG. 2 is a circuit block diagram of the photovoltaic devices ganged together in the embodiment of FIG. 1.

With reference now to FIG. 2, it can be seen that each strip 28 comprises a pair of strips 28a and 28b of opposite polarity, and in series interconnection at the boom end thereof. Isolation relays 34, preferably maintained within the roll 12 and optionally within the boom 16, are provided in the interconnection between the negative end of the strips 28a and the positive end of the strips 28b. The isolation relays allow for continued operation of the photovoltaic awning 10 even if a photovoltaic strip is removed from the circuit for any reason. The strips 28 are interconnected in series at the end of the awning 14 adjacent the roll 12, it being contemplated that the actual interconnection may be effected within the roll, but at the very least the conductors effecting the interconnection are so maintained. The strips 28 are in series connection with each other and include isolation relays 38 appropriately interposed therebetween. Power output lines 40 are interconnected to the first and last terminals of opposite polarity in the gang of strips 18, and pass outwardly from the roll 12, through a slip ring or other suitable connector configured to accommodate rotational movement, the same being designated by the numeral 42. The power output lines 40 pass through a service disconnect switch 44, preferably maintained within the control box 30. The disconnect service switch 44 allows an operator to disconnect the photovoltaic elements 28 from the output circuit. A fuse 46, for circuit protection, may also be included in the power lines 40 within the control box 30. In like manner, a ground fault isolator/protector 48 may also be so included. Finally, an inverter, adapted to change DC electrical power into AC electrical power, may be included in the control box 30, with power outlet lines 52 extending therefrom.

As presented above, there is significant concern over the stability of photovoltaic awnings when subjected to high winds. Flapping and fluttering of the awning could damage the sensitive photovoltaic material, yet it is desired that the awning be capable of withstanding moderate winds to ensure the generation of power on windy days. Preparation for such eventualities requires configuration of a photovoltaic awning that is structurally rigid and of significant integrity when deployed, and which can be rapidly retracted when needed in excessive wind.

With reference now to FIG. 3, a photovoltaic awning 60 having enhanced stability when deployed, is designated generally by the numeral 60. The photovoltaic awning 60 includes a cylindrical roll 62 which receives thereon and deploys therefrom a fabric or other appropriate awning 64. Photovoltaic film strips 66 are received upon the fabric of the awning 64 to be taken up onto and deployed from the roll 62. Again, a contoured drum 68 for cable take-up and pay-out is employed, for purposes presented above. A mounting bracket or side plate 70 is provided on each of the contoured or tapered drums 68 opposite the cylindrical roll 62. A service box 72 is provided on one of the side plates 70, and contains therein an appropriate controller, service disconnect circuitry, an inverter, and the like.

According to the invention, stability in the awning is attained by configuring the awning, when deployed, in a saddle-like configuration. This may be achieved in a number of ways, most notably by retaining one of the corners of awning out of plane with the others. By way of example, support legs may be employed for such a purpose, although various arrangements may be employed to effect the desired result. As shown in FIG. 3, a pair of support legs 72 may be provided at the roll end 62 of the system 60 such that the legs are fixed to and maintain the side plates 70, as shown. The support legs 74 are preferably of equal length and are typically mounted upon a appropriate planar surface such as a roof or the like.

An end tube 76, of suitable configuration, is provided in skewed relation to the roll 62 and spaced therefrom the length of the awning 64. The end tube 76 is supported by a first support leg 78 at one end thereof and a second support leg 80 at the opposite end. As is apparent from the exemplary embodiment of FIG. 3, a first support leg 78 is longer than the second support leg 80. In the embodiment shown, the support legs 74 are of equal length, with the support leg 78 being shorter than the support legs 74, but longer than the support leg 80. With this configuration, the awning 64, when deployed, is configured as a saddle, tensioning the fabric of the awning 64 by modifying the curvature of the surface of the awning from what would otherwise be a catenary surface. It will be appreciated that the legs 74, 78, 80 are spaced apart and arranged in somewhat rectangular configuration comporting to that of the awning fabric 64, but with the leg 80 being substantially shorter than the leg 78, a twist is introduced into the fabric 64, causing a saddle effect which has been found to add stability and integrity to the awning 64 sufficient to prevent or minimize flapping in high winds and the like.

As shown, a pair of side support tubes 82 extend between the area of each of the contoured drums 68 and the end tube 76. The side support tubes 82 are attached to the end tube 76 at the distal end of the assembly. A boom 84 is provided at an end of the awning fabric 64 opposite that of the roll 62. An end cap 86 is provided at the end of the side support tubes 72 supported by the end tube 76. A pulley mechanism 88, which will be described later herein, is provided in association with each of the end caps 86.

As shown in FIG. 3A, with one of the four corners of the awning 60 out of plane with the other four corners, the otherwise catenary configuration of the awning is transformed into a saddle configuration, providing a stable wind resistant structure. As shown in FIG. 3C, the position of the sheet of the awning 60 along the line B-D of FIG. 3B is substantially straight, having at most a catenary sag from its own weight. It has a downward slant because point D is out of plane with points A, B and C. However, along the line A-C of the opposite corners, a curvature is introduced because of the same out of plane arrangement, it being noted that the otherwise uniform catenary configuration from the roll 62 to the boom 84 is distorted by the lower leg 80 and out of plane point D, introducing the twist from A to C.

Figure 4:
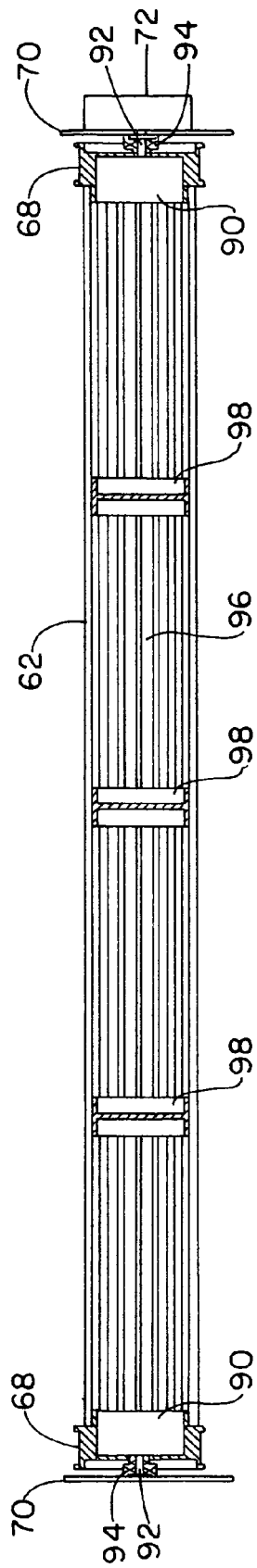
FIG. 4 is a cross sectional view of the awning roll and associated control mechanism of the embodiment of FIG. 3.

With reference now to FIG. 4, an appreciation can be obtained of the nature and structure of the cylindrical roll 62 employed in the embodiment 60. The roll 62 is provide with a hub 90 at each end thereof having a spindle 92 connected to and extending therefrom. The spindle 92 is received by an appropriate bearing 94 received and supported by the mounting bracket or side plate 70. The cylindrical roll 62 comprises a non-metallic composite shell or skin, preferably corrugated fiberglass, for strength, electrical insulation, and added benefits as described herein. The hub 90 and contoured drum 68 are mounted in an end of the fiberglass shell 96, which is wrapped thereabout. Positioned within the interior of the cylindrical roll 62, formed by the wrapped fiberglass shell 96, are reinforcing flanged disks 98, spaced therealong. In the context of the invention, it has been found that the troughs defined by the corrugations of the shell 96 provide effective conduits for the passing of the electrical conductors that, in the embodiment shown, series interconnect the photovoltaic films or strips 66. It will be appreciated that certain applications might require a parallel interconnection. The corrugations, of course, also serve to add strength and rigidity to the roll 62 and recesses for fasteners to the disks 98. In the context of the invention, corrugations need not be of any particular size, shape or spacing, but a single corrugation or two may be sufficient to impart strength, while providing a wiring conduit or the like. The resulting structure is simply one that is strong, rigid and light weight.

Figure 6:
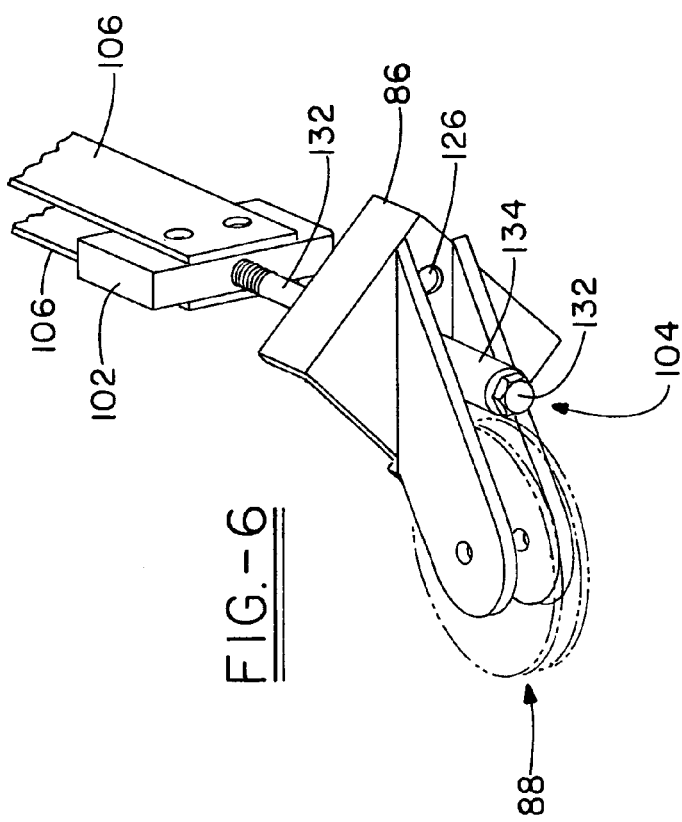
FIG. 6 is a perspective view of the end of the side rail of FIG. 5 having an end pulley thereon adapted for interconnection with the awning boom.
Figure 5:
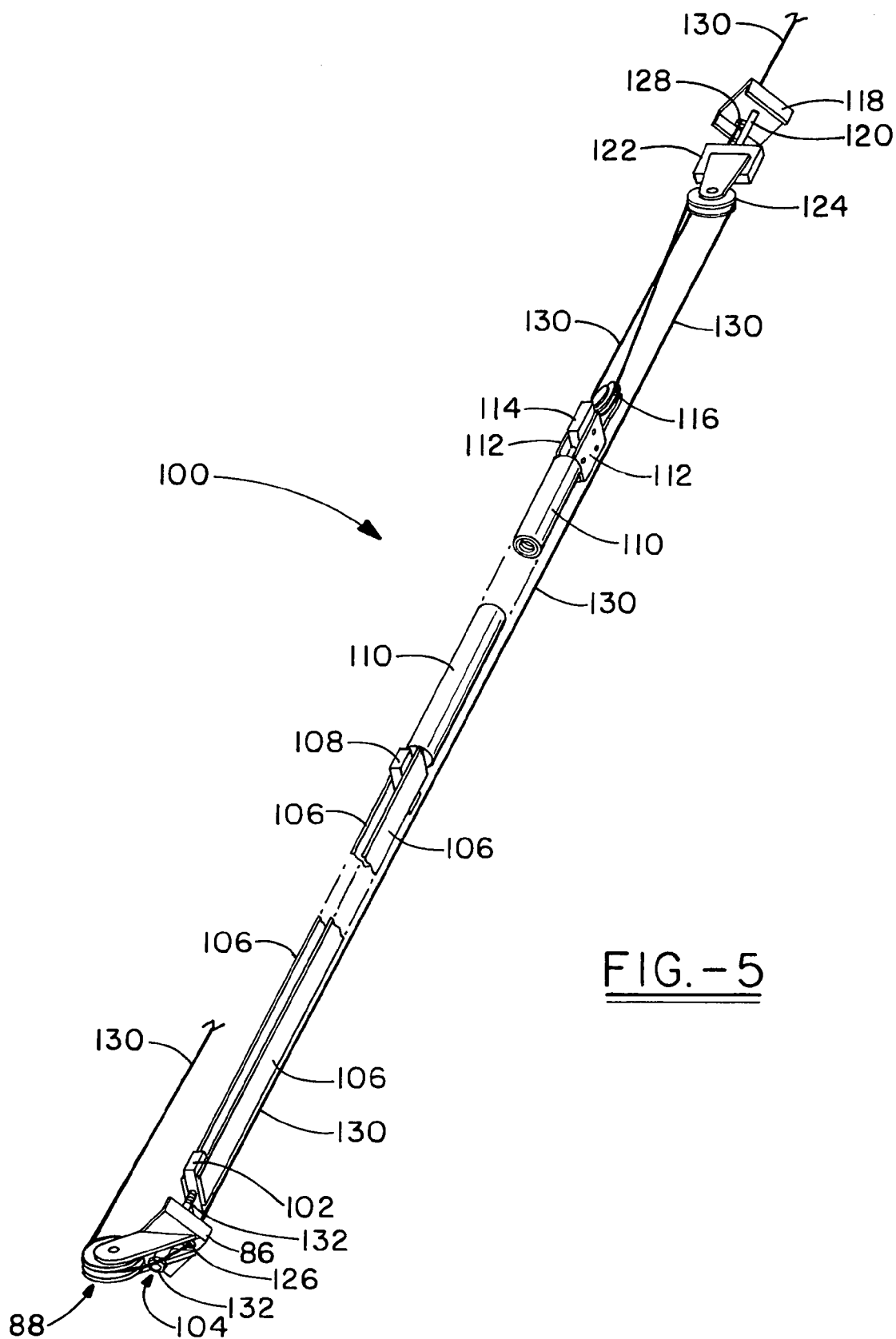
FIG. 5 is an assembly diagram of a side rail employed in association with a photovoltaic awning structure made in accordance with the invention.

With reference now to FIG. 5, an appreciation can be obtained with regard to the retraction mechanism 100 received within each of the support tubes 82 of the system of FIG. 3. As shown in FIGS. 5 and 6, a block 102 receives the end cap 86 and pulley mechanism 88 by means of an adjustment bolt and compression spring assembly 104. A pair of rails 106 are secured on opposite sides of a pair of blocks 102, 108 at opposite ends thereof.

A spring coil assembly 110 is secured at one end thereof to the block 108, and the other end thereof is secured to a block 114, which is sandwiched between a pair of plates 112. A pulley assembly 116 is secured to and received by the block 114.

As further shown in FIG. 5, an end cap 118 is secured by a pin or bolt assembly 120 to a block 122 that securedly receives a pulley assembly 124 at an end of the retraction mechanism 100 opposite that of the pulley mechanism 88. It will be appreciated that the end caps 86, 118 are received by opposite ends of the side support tube 82, as depicted in FIG. 3.

The end caps 86, 118 are provided with respective apertures 126, 128 through which the awning cable passes. As will be appreciated from FIGS. 3 and 5, the awning cable 130 passes from the boom 84 over a pulley wheel of the pulley assembly 88, through the aperture 126 of the end cap 86, about the pulley wheel 124 secured to the end cap 118, back around the pulley 116 secured to the block 114, and out of the aperture 128 of the end cap 118 to then be secured to the contoured drum 68.

It will be appreciated that the end caps 86 and 118 are fixed at opposite ends of the associated side support tubes 82, such that, as the awning is deployed from the awning roll 62, the spring 110 is tensioned as the pulley 116 and block 114 are pulled toward the end cap 118. This loading of the tensioning spring 110 then assists in retraction of the awning 64 onto the roll 62, which is particularly important if retraction is required for a rapidly approaching storm or the like.

Referring now to FIG. 6, an appreciation can be obtained with regard to the pulley mechanism 88. As shown, a bolt 132 is adapted to be threadingly received by the block 102, and is mounted within and through an appropriate compression spring 134. The bolt and compression spring assembly 132, 134 may be used to adjust a pre-load on the spring 110. In this regard, the position of the bolt 132 serves as an indicator of the spring load in the spring 110. It is contemplated that the pulley mechanism 88 may be provided with marks or other indicators that serve, in combination with the positioning of the bolt 132, to be an indicator of the pretension on the spring 110. Such marks might be presented upon the plates of the assembly 88 between which the pulley wheel is positioned. In the context of the invention, individual tensioning of each side of the awning is important for proper retraction of the saddle shaped awning. It is further contemplated that an electronic sensor, such as a linear variable differential transformer, potentiometer or the like might also be positioned in association with the bolt 132 to provide an electrical signal output correlated with such positioning and pre-load.

With reference now to FIG. 7, it will be appreciated that the side tube 82 is preferably of rectangular cross section, as is the assembly of the blocks 102, 108 and 114 and side rails 106. As shown in FIG. 7, the side rails 106, fixed to appropriate end blocks 102, 108, 114 is received within the side support tube 82 at a 90° offset, such that the assembly is effectively rotationally trapped or confined within or fixedly received by the associated side support tubes 82. This relationship prevents rotational movement and assures that only loading and unloading of the spring 110 occurs when the awning 64 is deployed or retracted.

It will be appreciated that an appropriate drive and retraction system such as that described in copending patent application Ser. No. 10/977,749, filed on Oct. 29, 2004, may be employed to facilitate extension and retraction.

Thus it can be seen that the aspects of the invention have been achieved by the structure presented and described herein. While in accordance with the patent statutes only the best mode and preferred embodiment of the invention has been presented and described in detail, the invention is not limited thereto or thereby. Accordingly, for an appreciation of the true scope and breadth of the invention, reference should be made to the following claims.

What is claimed is:

1. A deployable and retractable photovoltaic awning assembly, comprising:
    a sheet of photovoltaic devices;

a rotatable roll formed of a non-metallic composite corrugated material, corrugations of which define conduits, said corrugated material being connected to contoured drums at opposite ends thereof and receiving said sheet and adapted to alternatively rotatably pay-out said sheet and retract and retrieve said sheet;

a boom at an end of said sheet opposite said roll;

a cable connected to said boom at each of opposite ends thereof, said cables being windingly received by said contoured drums;

a pair of support tubes extending along opposite edges of said sheet between said ends of said booms and said contoured drums, said sheet having positioned thereabout a plurality of elongated strips of photovoltaic material;

conductors interconnecting said photovoltaic strips, said conductors being received within said roll and passing through said conduits; and reinforcing disks interposed between said contoured drums, and about which said non-metallic composite material is rolled.

2. The photovoltaic awning assembly as recited in claim 1, wherein said strips of photovoltaic material are connected together in series.

3. The photovoltaic awning assembly as recited in claim 1, further comprising isolation relays interposed between each of said series connected photovoltaic strips.

4. The photovoltaic awning assembly as recited in claim 1, wherein said photovoltaic strip comprises a pair of oppositely polarized strips, each said pair being joined together at said boom.

5. The photovoltaic awning assembly as recited in claim 1, further comprising a service box mounted adjacent one of said contoured drums and receiving therein components taken from the group comprising a disconnect switch, a DC to AC inverter, a ground fault protector, and an overcurrent protector.

6. The photovoltaic awning assembly as recited in claim 1, wherein said sheet has four corners and at least one of said corners of said sheet is out of plane with said other corners, introducing a twist into said sheet to form a saddle shape.

7. The photovoltaic awning assembly as recited in claim 6, wherein said at least one of said corners being out of plane with the others distorts the sheet from a catenary to a saddle shape.

8. The photovoltaic awning assembly as recited in claim 1, wherein each of said pair of support tubes comprises a tube having a cap at each end thereof, each cap having a pulley assembly attached thereto.

9. The photovoltaic awning assembly as recited in claim 8, wherein each said support tube comprises a spring connected at one end thereof to one of said caps, and having a pulley assembly connected to an opposite end.

10. The photovoltaic awning assembly as recited in claim 9, further comprising a cable connected to said boom and extending around said pulley assemblies and to said contoured drum.

11. The photovoltaic awning assembly as recited in claim 10, wherein said cable passes from said boom, through said pulley assembly of said cap nearest said boom, through said pulley assembly of said other cap, then through said pulley assembly connected to said spring, thence to said contoured drum.

12. The photovoltaic awning assembly as recited in claim 11, further comprising a means to adjust the tension in said spring.

13. The photovoltaic awning assembly as recited in claim 12, wherein said means comprises a bolt operatively connected to one end of said spring and having a compression spring thereabout.

14. The photovoltaic awning assembly as recited in claim 13, wherein said means further comprises markings indicative of a preset force.

15. The photovoltaic awning assembly as recited in claim 12, wherein said spring is connected to said one of said caps through a linkage having a cross section that engages an interior of said tube, thereby precluding rotation of said linkage.

* * * * *